United States Patent [19]
Yasuda et al.

[11] Patent Number: 5,404,018
[45] Date of Patent: Apr. 4, 1995

[54] METHOD OF AND AN APPARATUS FOR CHARGED PARTICLE BEAM EXPOSURE

[75] Inventors: Hiroshi Yasuda; Yoshihisa Oae; Akio Yamada; Nobuyuki Yasutake; Hisayasu Nishino, all of Kawasaki, Japan

[73] Assignee: Fujitsu Limited, Kawasaki, Japan

[21] Appl. No.: 843,172

[22] Filed: Feb. 28, 1992

[30] Foreign Application Priority Data

Feb. 28, 1991 [JP] Japan .................................. 3-034424

[51] Int. Cl.$^6$ ............................................... H01J 3/26
[52] U.S. Cl. ................................. 250/492.22; 437/935; 250/400
[58] Field of Search ........... 250/396 ML, 396 R, 398, 250/400, 492.2, 492.22; 437/935; 364/489, 490

[56] References Cited

U.S. PATENT DOCUMENTS

| | | | |
|---|---|---|---|
| 4,494,004 | 1/1985 | Mauer, IV et al. | 250/492.2 |
| 4,607,333 | 8/1986 | Yusutake et al. | 364/400 |
| 4,853,870 | 8/1989 | Yasutake et al. | 364/490 |
| 5,134,300 | 7/1992 | Kai et al. | 250/492.2 |

*Primary Examiner*—Paul M. Dzierzynski
*Assistant Examiner*—David V. Bruce
*Attorney, Agent, or Firm*—Staas & Halsey

[57] ABSTRACT

A charged particle beam exposure apparatus employs a main deflector made of electromagnetic coils and a subdeflector made of electrostatic deflection electrodes. An exposure method used for this apparatus is capable of shortening a wait time of the main deflector. The main deflector deflects a charged particle beam in a direction X, while the subdeflector deflects the beam around the deflecting position of the main deflector to expose an object to the beam. An area to be exposed on the object is divided into thin subfields such that the width, in an X-axis direction of each subfield, is approximately ⅓ the length in a Y-axis direction of the same.

11 Claims, 10 Drawing Sheets

DIVISION OF A PATTERN

DAC OUTPUT V1

MONITORED VOLTATAGE OF COIL CURRENT V2

DIFFERENTIAL SIGNAL V3

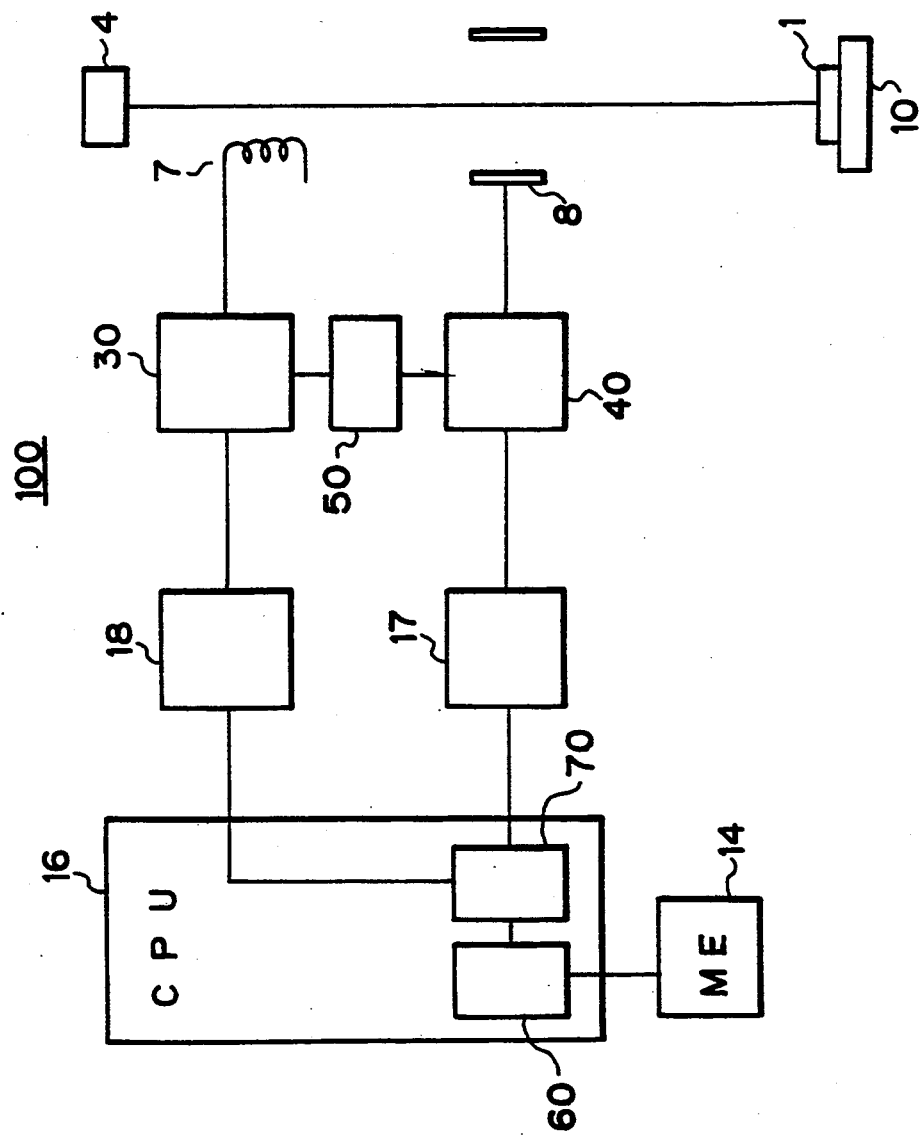

DAC OUTPUT VOLTAGE

MONITORED COIL CORRENT

DIFFERENTIAL SIGNAL

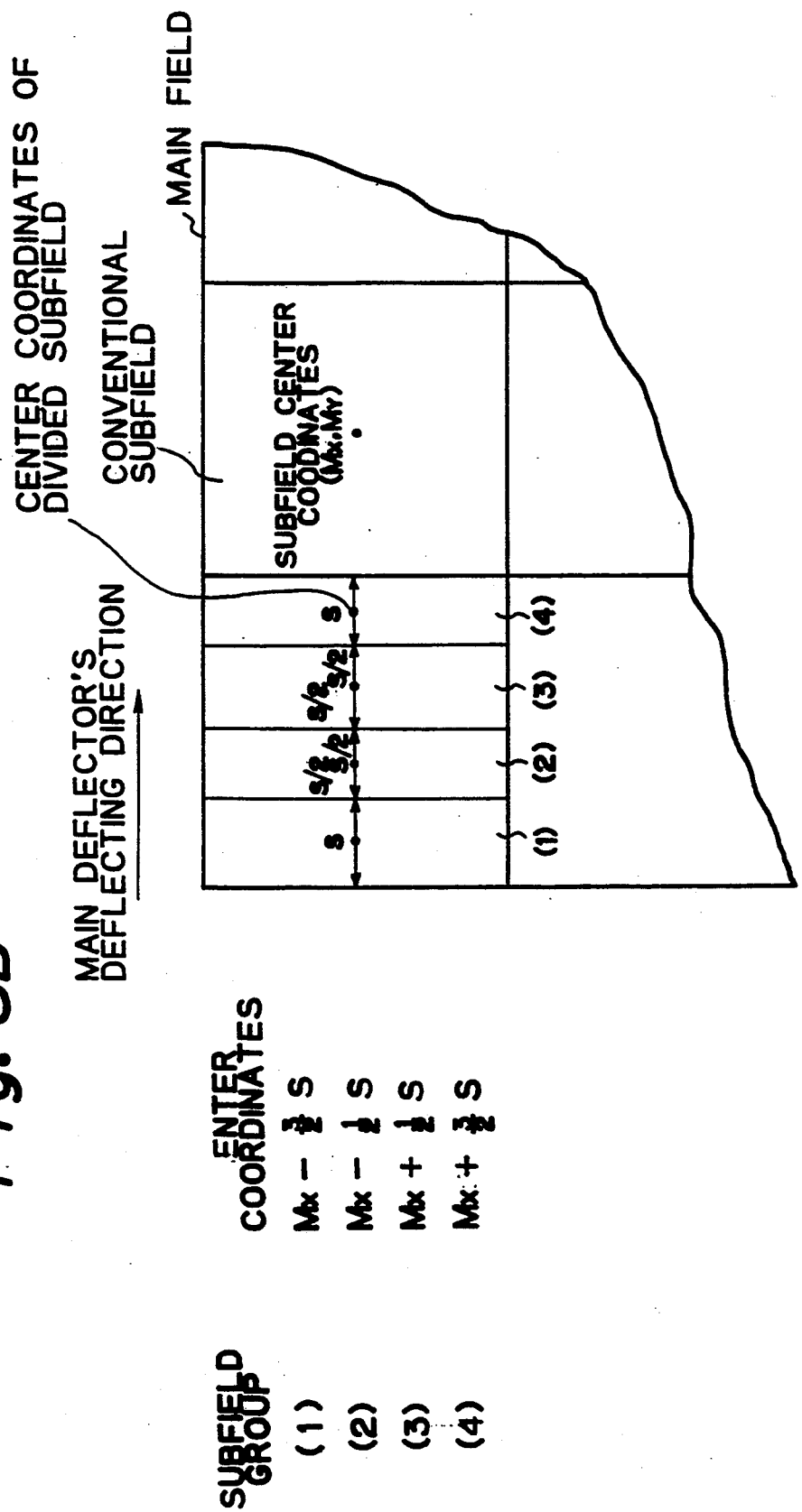

METHOD OF AND AN APPARATUS FOR CHARGED PARTICLE BEAM EXPOSURE

BACKGROUND OF THE INVENTION

1. Field of the Invention

This invention relates to a charged particle beam exposure technique, and particularly to a charged particle beam exposure technique for drawing fine patterns such as on ICs by using charged particle beams, e.g., electron beams.

2. Description of the Related Art

ICs have improved in integration and function in recent years, and continue to play a major role in technological advancement in the field of computers, communications, machine control, etc. ICs have achieved quadruple integration in the past two to three years, and DRAMs have rapidly advanced in integration from 1 Mb to 4 Mb, 16 Mb, and 64 Mb.

Such high integration is achievable only with advancements in fine processing. The current level fine processing has mainly been due to an optical exposure technique. Current optical exposure technique realize a precision of 0.5 $\mu$m. It is said that the limit of the optical exposure technique lies around 0.3 $\mu$m. It is difficult, therefore, to optically form a fine pattern of 0.15 $\mu$m or below.

On the other hand, a charged particle beam exposure technique is applicable for a fine processing of 0.10 $\mu$m or below at a positioning accuracy of 0.05 $\mu$m or below.

However, conventional charged particle beam exposure techniques are not suitable for mass-producing LSIs because they achieve low throughput. New techniques such as a block exposure method and a blanking aperture array method proposed by the inventors of the present invention realize a throughput of about 1 cm$^2$/sec. With such throughput ensured, the charged particle beam exposure technique is more advantageous than any other lithography techniques in terms of fine processing, positioning accuracy, quick turnaround, reliability, and software improvement.

The charged particle beam exposure technique involves two deflectors for deflecting charged particle beams; an electrostatic deflector, and an electromagnetic deflector. Generally, the electrostatic deflector is speedier than the electromagnetic deflector.

A lens barrel for charged particle beams is sometimes designed to contain only the electrostatic deflectors to improve exposure speed. For high-speed exposure, it is also necessary to increase the intensity (current density) of a charged particle beam, e.g., an electron beam. To increase the current density as well as secure resolution of the beam, it is necessary to shorten the focal length and minimize the spherical and chromatic aberration of at least the last projection lens in the barrel.

A patterned beam of large current density contains many electrons which act to blur the beam itself because of Coulomb's force acting between the electrons. To reduce the blur, the lenses in the barrel must be short. When an electromagnetic lens is shortened with deflection being carried out only with the electrostatic deflectors, deflection efficiency drastically deteriorates. In particular, the throughput of step-and-repeat mode exposure drops below a usable level. Even continuous movement mode exposure will not provide a practical exposure speed if a deflection width is less than 1 mm and if a stage moving speed is less than 100 mm/s.

To improve deflection efficiency, the voltage of an electrostatic deflection amplifier may be increased. The high-output-voltage transistors, used for this purpose, however, are slow and frequently malfunction.

Even if these problems are solved, in order to use the electrostatic deflector as a main deflector, it may not be disposed above a subdeflector used for scanning subfields of an exposure object, because the subdeflector is also an electrostatic deflector. Instead, they must be arranged side by side.

Because of this, the lenses cannot be reduced beyond a certain length. This means that the blur because of Coulomb's force will not effectively be removed.

Accordingly, a practical electron beam exposure apparatus uses both an electromagnetic deflector and an electrostatic deflector.

The electromagnetic deflector comprises a plurality of coils disposed orthogonally to a beam axis and is capable of widely deflecting a beam even in a direction orthogonal to the beam axis. Since the electromagnetic deflector uses coils, it takes a long time for a current disturbed by inductance of the coils to settle.

In addition, a beam position is sometimes changed by an eddy current, and therefore, a time is needed for settling the beam position.

The inventors of the present invention have proposed a method of shortening the settling time required by the main deflector (U.S. Pat. No. 4,607,333).

A charged particle beam exposure apparatus according to this proposal will be roughly explained with reference to FIGS. 1 and 2.

FIG. 1 schematically shows the charged particle beam (electron beam (EB)) exposure apparatus.

A lens barrel includes a beam source 4 for emitting a charged particle (electron) beam 24. The beam 24 is widely deflected by a main deflector 7 composed of electromagnetic coils, and narrowly and quickly deflected by a subdeflector 8 composed of electrostatic deflector electrodes 8a and 8b. A shutter 11, such as a blanking electrode, is disposed across the axis of the beam 24 to optionally turn ON and OFF the beam 24. A wafer 1 to be exposed to the beam 24 is placed on a movable stage 10. According to a continuously moving method, the stage 10 is continuously moved in one direction.

Exposure pattern data are stored in a memory 14, and when required, read by a CPU 16 through a bus 15. Digital pattern data provided by the CPU 16 are processed by digital control circuits 17 and 20, converted into analog signals by digital-to-analog converters (DACs) 18a, 18b, and 21, and supplied to amplifiers 19a, 19b, and 23. The amplifier 23 is for the main deflector 7. An amplified signal from the amplifier 23 is further amplified by an amplifier 22 and supplied as a current I to the coils of the main deflector 7. The current I flowing through the deflector 7 produces, through a monitor resistor RM, a voltage V2 that is proportional to the current. Since the main deflector 7 has inductance L, it takes time for the current I to rise. Accordingly, during a transient period, the output voltage of the amplifier 23 changes differently from the output current I of the amplifier 22.

The output voltage of the amplifier 23 is amplified by an adjusting amplifier 29 to a voltage V1 corresponding to the output voltage V2 of the monitor resistor RM. The voltages V1 and V2 are supplied to a differential amplifier 25. In a steady state, the two voltages V1 and V2 are equal to each other.

The differential amplifier 25 generates an output voltage V3 according to the difference between the voltages V1 and V2. The output voltage V3, i.e., a differential signal is supplied to amplifiers 26 and 28 through resistors R1a and R1b. The differential signal to the amplifier 28 is inverted through an inverter 27.

The subdeflector amplifiers 19a and 19b supply voltages of opposite polarities to the amplifiers 26 and 28 through resistors R2a and R2b, respectively. The amplifiers 26 and 28 have feedback resistors R3a and R3b, respectively. The amplifiers 26 and 28 supply voltages to the electrodes 8a and 8b of the subdeflector 8 for scanning subfields with the beam 24.

According to U.S. Pat. No. 4,607,333, a pattern to be drawn on the wafer 1 is divided into subfields as shown in FIG. 2(A). Namely, a field 30 on the wafer 1 is divided into a plurality of long stripes 31 that extend in a stage moving direction indicated by an arrow mark P. Each of the stripes 31 is divided into a plurality of bands 32 that are orthogonal to the stage moving direction P. Further, each of the bands 32 is divided into subfields 33 that are scanned by the subdeflector 8.

To scan the subfields 33, the main deflector 7 deflects the beam 24 to the center of one of the subfields, and the high-speed subdeflector 8 deflects the beam 24 to draw patterns in the subfield. If the subdeflector 8 has a deflectable area of, for example, 100 $\mu$m $\times$ 100 $\mu$m, the subfield 33 also has an area of 100 $\mu$m $\times$ 100 $\mu$m.

To successively expose the stripes 31, the stage 10 is continuously moved in the direction P, and the beam 24 is successively deflected to the centers of the subfields 33 in each stripe 31. While the main deflector 7 is oriented toward the center of one subfield 33, the subdeflector I]deflects the beam 24 within the subfield 33 to draw patterns in the subfield 33. After the subfield 33 is exposed, the beam 24 is deflected by the main deflector 7 to the center of the next subfield 33, and then deflected by the subdeflector 8 to expose the subfield 33 in question.

When operating the main deflector 7, the output of the main deflector amplifier 23 rises differently from the current I flowing through the main deflector 7.

FIG. 2(B) shows changes in the voltage V1 that correspond to a rising output voltage of the DAC 21. The DAC 21 voltage and amplifiers 23 and 29 voltage rise quickly, so that a change in the voltage V1 corresponding to a movement of 100 $\mu$m can be completed within 1 to 2 $\mu$sec.

On the other hand, the current I flowing through the coils of the main deflector 7 needs a long time to rise because of the inductance L of the coils. FIG. 2(C) shows a rising waveform of the output voltage V2 of the monitor resistor RM corresponding to the coil current I. The voltage V2 rises relatively slowly, overshoots, and gradually settles. It takes about 100 $\mu$sec for the coil current I to settle.

If a wait time of 100 $\mu$sec is needed whenever the position of the beam 24 is deflected by the main deflector 7, a wait time of one second will be needed to expose an area of 10 mm square. If an actual exposure time is one second, two seconds in total will be needed.

To shorten this wait time, the differential amplifier 25 detects a difference between the output voltage of the DAC 21 and the monitor voltage of the coil current I, and provides a compensation voltage, i.e., a differential signal V3.

FIG. 2(D) shows a waveform of the differential signal V3. The differential signal V3 rises as the output of the DAC 21 rises, then gradually falls according to a rise of the monitor voltage of the coil current I, and settles.

Referring again to FIG. 1, the differential signal V3 is additionally applied to the subdeflector amplifiers 26 and 28. As a result, even if the coil current I is not yet stable, the differential signal V3 which settles relatively quickly compensates changes in magnetic fields, to thereby enable patterns to be drawn at a required accuracy. A time necessary for stabilizing the differential signal V3 at a compensation possible value is about 40 $\mu$sec, which corresponds to about 10 $\mu$m in terms of positional change. By feeding the differential signal V3 back to the subdeflector 8, the wait time of the main deflector 7 can be shortened from about 100 $\mu$sec to about 40 $\mu$sec.

Although this technique halves the wait time of the main deflector 7, the shorter the wait time, the better.

SUMMARY OF THE INVENTION

An object of the present invention is to provide a method of minimizing the wait time of a main deflector in a charged particle beam exposure apparatus having the main deflector made of electromagnetic coils and a subdeflector made of electrostatic deflection electrodes.

Another object of the invention is to provide a charged particle beam exposure apparatus employing the above-stated method.

To accomplish the objects, a charged particle beam exposure apparatus according to the invention includes a charged particle beam source for emitting a charged particle beam; an electromagnetic main deflector for widely deflecting the beam; an electrostatic subdeflector for speedily and precisely deflecting the beam; a movable stage for supporting and moving an object to be exposed to the beam for a predetermined distance; a main deflector driving means for driving the main deflector; a subdeflector driving means for driving the subdeflector; a main deflector control means for controlling tile main deflector driving means; a subdeflector control means for controlling the subdeflector driving means; an exposure pattern data memory for storing all exposure pattern data to be drawn on the object by exposure; and a data processing means for reading exposure pattern data for one main field of the object out of the exposure pattern data memory, controlling the main deflector control means according to the read data such that the beam is oriented toward the main field and successively deflected toward a plurality of subfields defined in the main field, and controlling the subdeflector control means according to subfield data contained in the read data such that the beam is deflected toward predetermined regions in each of the subfields. The apparatus is characterized by a subfield forming means disposed in the data processing means, for dividing a main field into a plurality of subfields according to exposure pattern data for the main field read out of the exposure pattern data memory, such that each of the subfields has a rectangular shape whose short sides extend in a primary deflecting direction of the main deflector.

A charged particle beam exposure method according to the invention is applicable for a charged particle beam exposure apparatus having a charged particle beam source for emitting a charged particle beam; an electromagnetic main deflector for widely deflecting the beam; an electrostatic subdeflector for speedily and precisely deflecting the beam; a movable stage for supporting and moving an object to be exposed to the beam for a predetermined distance; a main deflector driving means for driving the main deflector; a subdeflector driving means for driving the subdeflector; a main deflector control means for controlling the main deflector driving means; a subdeflector control means for controlling the subdeflector driving means; an exposure pattern data memory for storing all exposure pattern data to be drawn on the object by exposure; and a data processing means for reading exposure pattern data for one main field of the object out of the exposure pattern data memory, controlling the main deflector control means according to the read data such that the beam is oriented toward the main field and successively deflected toward a plurality of subfields defined in the main field, and controlling the subdeflector control means according to subfield data contained in the read data such that the beam is deflected toward predetermined regions in each of the subfields. The method basically comprises a step of dividing a main field into a plurality of subfields according to exposure pattern data for the main field read out of the exposure pattern data memory such that each of the subfields has a rectangular shape whose short sides extend in a primary deflecting direction of the main deflector; a step of supplying data for a reference beam position for the main field to the main deflector control means; a step of successively selecting the subfields one by one in the main field and supplying data for a reference beam position for the selected subfield to the main deflector control means; a step of supplying exposure pattern data for the selected subfield to the subdeflector control means; and a step of exposing the selected subfield to the beam according to the exposure pattern data by deflecting the beam within the subfield by the subdeflector with the cooperation of the main deflector control means and subdeflector control means.

According to the charged particle beam exposure apparatus and method of the invention, the electromagnetic main deflector deflects a charged particle beam in a direction X, and the electrostatic subdeflector deflects the beam to peripheral positions around the position to which the beam has been deflected by the main deflector. The apparatus and method may employ a step of dividing a main field to be exposed into thin subfields whose width along, for example, an axis X is shorter than that along an axis Y; a step of sequentially setting data for reference positions of subfields that are arranged side by side in the direction X to a digital-to-analog converter for the main deflector; and a step of deflecting the beam by the subdeflector to expose the subfields to the beam according to a correction voltage corresponding to a change in a current flowing through the main deflector and pattern data for the subfields after an output voltage of the digital-to-analog converter is substantially stabilized. The width of each subfield along the axis X is set such that a positional change occurring at a rise of the current flowing through the main deflector can be corrected by deflecting the subdeflector according to the correction voltage.

Since the width of each subfield along the axis X is shorter than that along the axis Y, a moving distance of the beam from one subfield to the next in the X-axis direction becomes shorter. The width of each subfield along the axis X that determines the moving distance is set such that a positional change caused at a rise of the current flowing through the main deflector is correctable according to the correction voltage produced according to the current flowing through the main deflector. Accordingly, once the output voltage of the digital-to-analog converter is stabilized, exposure is carried out at the required accuracy.

Since it is easy to realize a rise time of, for example, 2 to 3 $\mu$sec or below for the digital-to-analog converter, the wait time of the main deflector can be greatly shortened.

BRIEF DESCRIPTION OF THE DRAWINGS

FIGS. 2(A) to 2(D) are views showing a conventional charged particle beam exposure method, in which FIG. 2(A) is a plan view explaining the division of an exposure pattern into subfields, FIG. 2(B) a graph showing changes in an output voltage of a DAC for a main deflector, FIG. 2(C) a graph showing a waveform of a monitor voltage of a coil current to the main deflector, and FIG. 2(D) a graph showing a waveform of a differential signal representing the difference between the output voltage of the DAC and the monitor voltage of the coil current;

FIG. 3 is a block diagram schematically showing a charged particle beam exposure apparatus according to the invention;

FIGS. 4(A) to 4(C) are views showing a charged particle beam exposure method according to an embodiment of the invention, in which FIG. 4(A) is a plan view showing the division of an exposure pattern into subfields, FIG. 4(B) an enlarged plan view showing one subfield, and FIG. 4(C) a plan view showing a relationship between a feedback compensation possible area and a subfield;

FIGS. 6(A) to 6(C) are views showing characteristics of the embodiment of FIG. 4, in which FIG. 6(A) is a graph showing changes in an output voltage of a DAC for a main deflector, FIG. 6(B) a graph showing changes in a monitor voltage of a coil current to the main deflector, and FIG. 6(C) a waveform showing a differential signal representing the difference between the output voltage of the DAC and the monitor voltage of the coil current; and FIGS. 7(A), 7(B), 8(A), and 8(B) are views explaining subfield forming processes according to the invention.

DESCRIPTION OF THE PREFERRED EMBODIMENTS

Figure 1:
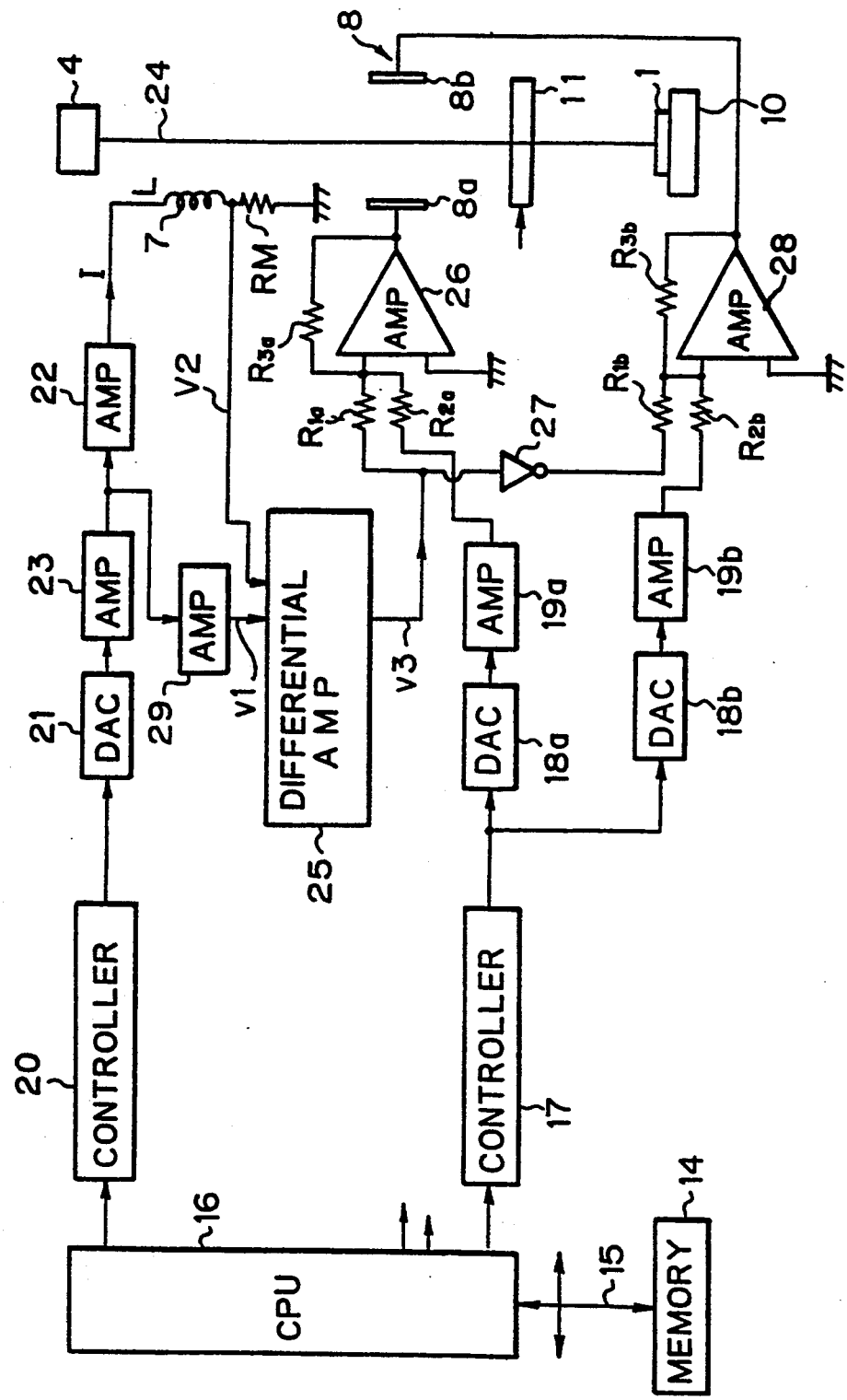
FIG. 1 is a block diagram schematically showing a charged particle beam exposure apparatus.
Figure 2A:
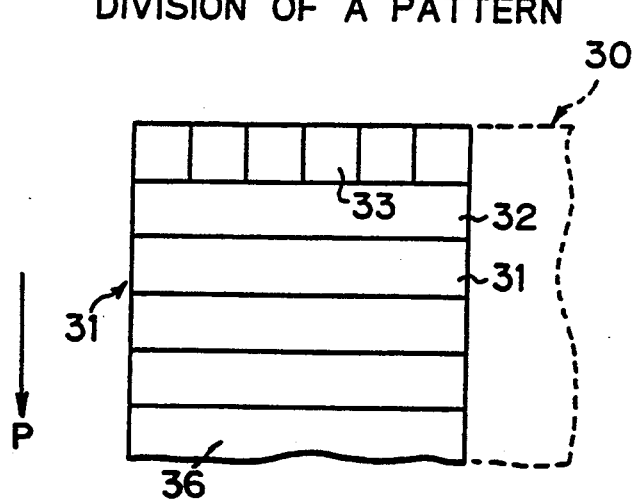
Figure 2B:
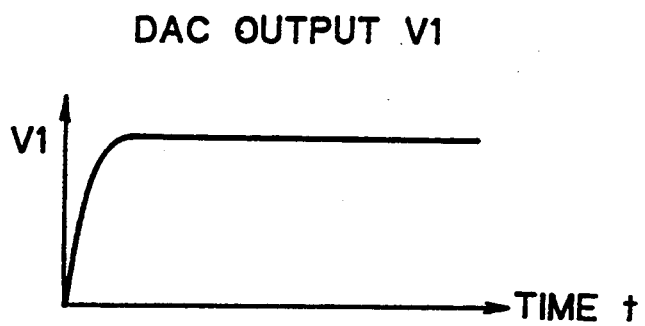
Figure 2C:
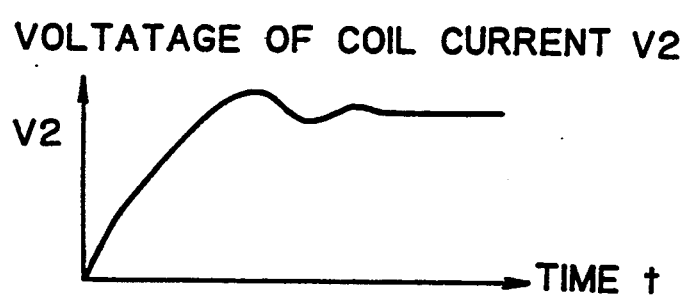
Figure 2D:
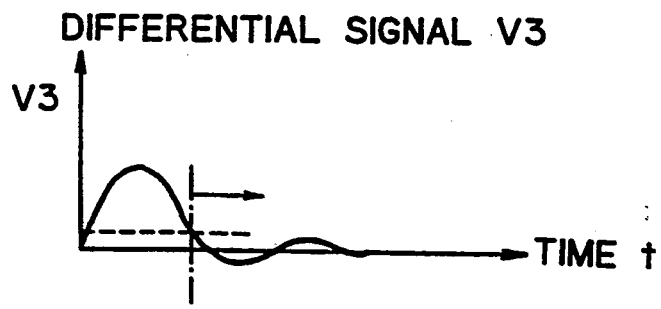

An embodiment of the invention will be explained in detail with reference to FIGS. 3 and 4.

FIG. 3 is a block diagram showing a charged particle beam exposure apparatus 100 according to the preferred embodiment of the invention. The apparatus 100 comprises a charged particle beam source 4 for emitting a charged particle beam; an electromagnetic main deflector 7 for widely deflecting the beam; an electrostatic subdeflector 8 for speedily and precisely deflecting the beam; a movable stage 10 for supporting and moving an object 1 to be exposed to the beam for a predetermined distance; a main deflector driver 30 for driving the main deflector 7; a subdeflector driver 40 for driving the subdeflector 8; a main deflector controller 18 for controlling the main deflector driving means 30; a subdeflector controller 17 for controlling the subdeflector driving means 40; an exposure pattern data memory 14 for storing all exposure pattern data to be drawn on the object 1 by exposure; and a data processing unit 16 for reading exposure pattern data for one main field 36 of the object 1 out of the exposure pattern data memory 14, controlling the main deflector controller 30 according to the read data such that the beam is oriented toward the main field 36 and successively deflected toward a plurality of subfields 33 defined in the main field 36, and controlling the subdeflector controller 40 according to subfield data contained in the read data such that the beam is deflected toward predetermined regions in each of the subfields 33.

The data processing means 16 has a buffer 60 for temporarily storing exposure pattern data for one main field read out of the exposure pattern data memory 14, and a subfield forming unit 70 connected to the buffer 60, for dividing the main field into the subfields 33 according to the read data such that each of the subfields has a rectangular shape whose short sides L1 extend in a primary deflecting direction of the main deflector 7, e.g., the direction of an axis X.

To expose a subfield of 100 μm square to a beam, the prior art needs a wait time of about 40 μsec, even with the help of the feedback means. The inventors found that such a long wait time was due to hardware limitation and that this limitation could be solved by software.

According to the prior art, each of subfields 33 defined in one main field 36 has a square shape whose area is typically 100 μm square. To successively expose the subfields 33 to a beam, the beam is jumped from one subfield to the next. If a distance between adjacent subfields is 100 μm, it takes a time $\tau$ for the beam to jump to a target position in the next subfield and ready for exposure, i.e., to get a width of 1/e. The time $\tau$ is very long in the prior art.

Since the beam must be successively deflected to all of the subfields, the time $\tau$ seriously influences total exposure time.

To shorten the time $\tau$ required for obtaining the width 1/e (a wait time needed by the main deflector for a jump), each deflection distance of the beam is shortened. According to this, exposure data for each subfield is prepared according to entire exposure data stored in the exposure data memory 14, such that each subfield has a rectangular shape whose short sides extend in a primary deflecting direction of the main deflector. Namely, the invention reduces each distance of a beam deflected by the main deflector, thus reducing the time $\tau$ required for the beam to obtain the width 1/e.

According to a preferred embodiment of the invention, the short sides of each rectangular subfield preferably extend in a direction in which the number of jumps of the beam by the main deflector is larger. If this direction is the direction of an axis X, the long sides of the rectangular subfield extend in the direction of an axis Y. The length of the long side of the subfield may be equal to the length of a side of a conventionally formed subfield, e.g., 100 μm.

The length of the short side of the subfield according to the invention is not particularly limited. Although the time $\tau$ for obtaining the width 1/e is preferably below 10 μsec, the length of the short side of the subfield must not be so short as to increase the number of exposure operations and elongate overall exposure time. Accordingly, the length of the short side of the subfield is preferably ½ to 1/5, and more preferably ⅓ to 1/5 the length of the long side of the subfield.

With the length of the short side of the subfield being S and the length of one time of deflection by the main deflector being L, exposure data for the subfield will fall in a range of ±½S. It is preferable, therefore, to maintain the following conditions:

$$S \pm \tfrac{1}{2} {}^* S \leq \tfrac{1}{2} {}^* L$$

$$S/L \leq \tfrac{1}{3}$$

Accordingly, the optimum length of the short side of a subfield will be ⅓ the length of the long side of the subfield.

Figure 5:
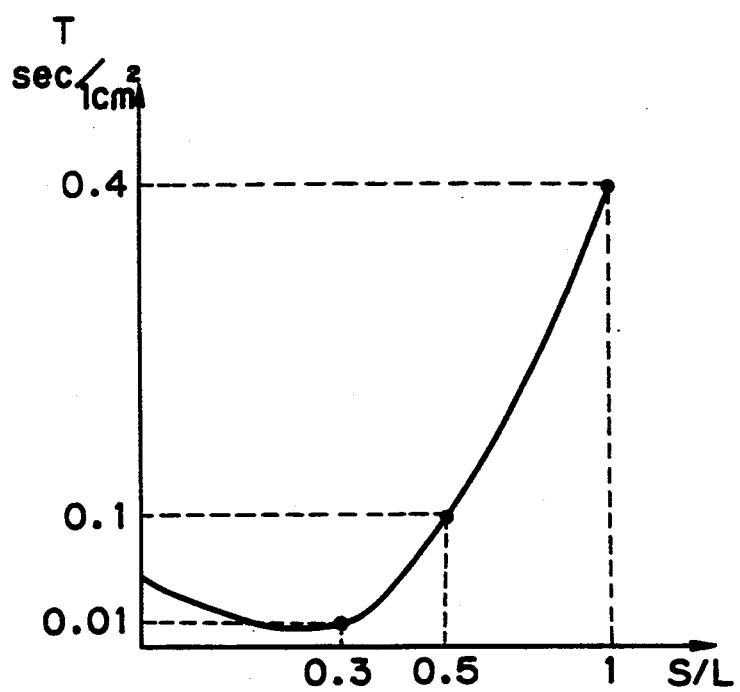
FIG. 5 is a graph explaining an effect of the invention.

FIG. 5 is a view showing a relationship between an axial ratio and a jump wait time T. The axial ratio is a ratio of the length of a short side of a subfield to that of a long side thereof. In the figure, the length of the long side is equal to the deflection possible range of the main deflector, i.e., 100 μm. The jump wait time T is a time necessary for the main deflector to settle after a jump.

According to the prior art, the ratio S/L is 1, and a corresponding jump wait time T is 0.4 sec/cm². According to the present invention, the ratio S/L may be 0.52 for realizing a jump wait time T of 0.01 sec/cm², and S/L of 0.33 for a jump wait time T of 0.01 sec/cm² at the minimum. When the ratio S/L is reduced below 0.52, the jump wait time T starts to increase. Based on these figures the length of the short side of a subfield is determined.

The apparatus and method according to the present invention is applicable for and achievable in the charged particle beam exposure apparatus of FIG. 1.

In FIG. 1, the main deflector 7 can deflect the beam 24 within an area of 2 mm square. Although the main deflector 7 of FIG. 1 is depicted with a single coil, it actually involves two coil sets orthogonal to axes X and Y, respectively, that are orthogonal to the axis of the beam 24. Each coil set includes 2 to 4 coils connected in series. Inductance of the coils is, for example, about 40 μH, and the quantity of heat produced at a field end (at maximum deflection) per axis is about 10 W.

When each subfield has an area of 100 μm square, a positional shift caused by an eddy current produced during subfield-to-subfield deflection is about 0.05 to 0.10 μm. If an eddy current compensator, using a knife edge and a reflection electron detector proposed in U.S. Pat. No. 4,585,943 is used, the positional shift due to the eddy current may be reduced to about 0.01 to 0.02 μm.

When the width of the subfield is reduced to about 10 μm, a jump between adjacent subfields by the main deflector 7 will be about 10 μm. As a result, the positional shift due to the eddy current is also reduced to 1/5 or below because the current flowing through the coils of the main deflector 7 becomes small.

To provide an output change corresponding to the jump of 10 μm, a 20-bit output of the DAC 21 is able to settle within about 1 μsec. A rise time for the output of the DAC 21 is also reduced to about ½ of that for the 100 μm jump. The memory 14 and digital control circuits 17 and 20 are designed to have a storage capacity ten times the number of subfields. Other arrangements are the same as those explained above.

Similar to the conventional apparatus, the apparatus of the invention may have a feedback means 50 (FIG. 3) for detecting the difference between a present beam position to be deflected by the main deflector driving means and a beam position calculated from exposure data, and feeding the difference back to the subdeflector driving means.

Figure 4A:
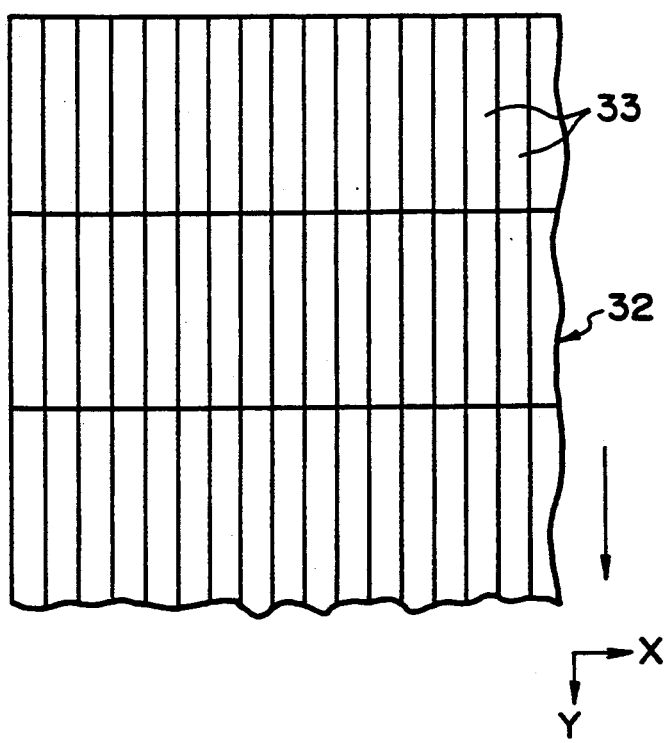
Figure 4B:
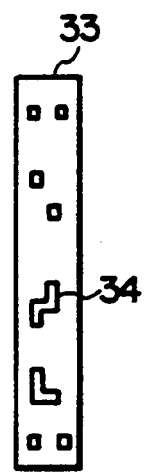
Figure 4C:
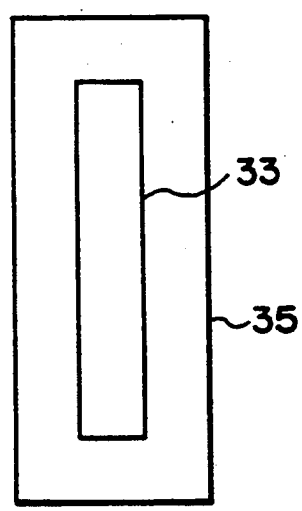

FIGS. 4(A) to 4(C) show a charged particle beam exposure method according to an embodiment of the invention.

FIG. 4(A) is a plan view showing a model of the division of an exposure pattern into subfields. An area to be exposed is first divided into a plurality of thin bands 32 that are substantially orthogonal to a stage moving direction indicated with an arrow mark. Namely, the bands 32 extend in the direction of an axis X. Each of the bands 32 is divided into thin subfields 33 that extend in the direction of an axis Y that is orthogonal to the axis X. A charged particle beam is kept at a fixed position by the main deflector, and deflected by the subdeflector to draw patterns in a corresponding subfield 33.

FIG. 4(B) is an enlarged view showing one subfield 33. Exposure patterns 34 are distributed in the subfield. These exposure patterns are drawn by deflecting the beam by the subdeflector.

FIG. 4(C) shows a relationship between the subfield 33 and a deflectable range of the electron beam exposure apparatus.

According to the electron beam exposure apparatus of FIG. 1, a difference between a rising voltage of the DAC 21 and a rising voltage of the coil current monitoring resistor RM is amplified by the differential amplifier 25, and fed back to the subdeflector amplifiers 26 and 28 to compensate for a current shortage in the coils of the main deflector 7.

In FIG. 4(C), numeral 35 denotes an area in which a beam position is correctable by such feedback control. This feedback possible area 35 is smaller than the deflection possible area of the subdeflector. For example, if the deflection possible area of the subdeflector is about 100 $\mu$m, the feedback correction possible area 35 is about 10 $\mu$m in width. Namely, if each subfield 33 is about 10 $\mu$m wide and about 100 $\mu$m long, the feedback correction possible area 35 will be about 10 $\mu$m wide around the subfield 33.

According to a preferred embodiment of the present invention, the subfield has a rectangular shape of about 10 $\mu$m wide in the direction of the axis X and about 100 $\mu$m long in the direction of the axis Y. Accordingly, a distance in the X-axis direction between adjacent subfields 33 in FIG. 4(A) is about 10 $\mu$m. Since the feedback correction possible area 35 is about 10 $\mu$m wide, the next subfield is contained in the correction possible area 35 even if a coil current to the main deflector does not rise to deflect a beam to the next subfield in the X-axis direction.

Figure 6A:
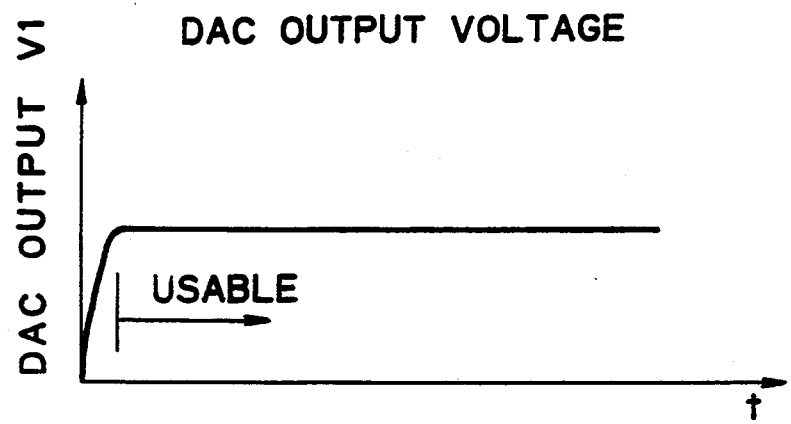
Figure 6B:
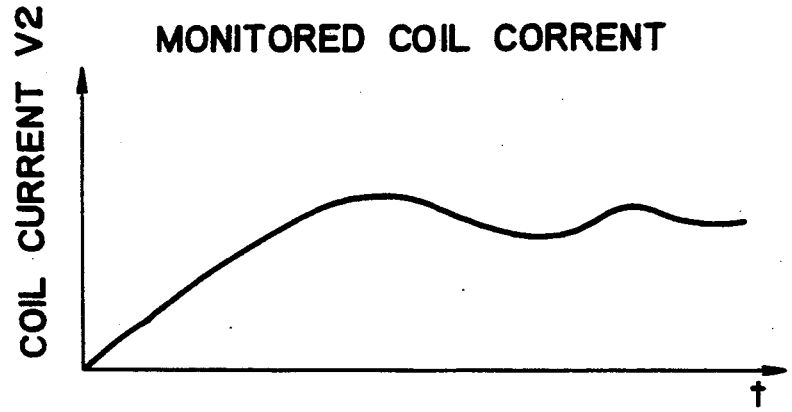
Figure 6C:
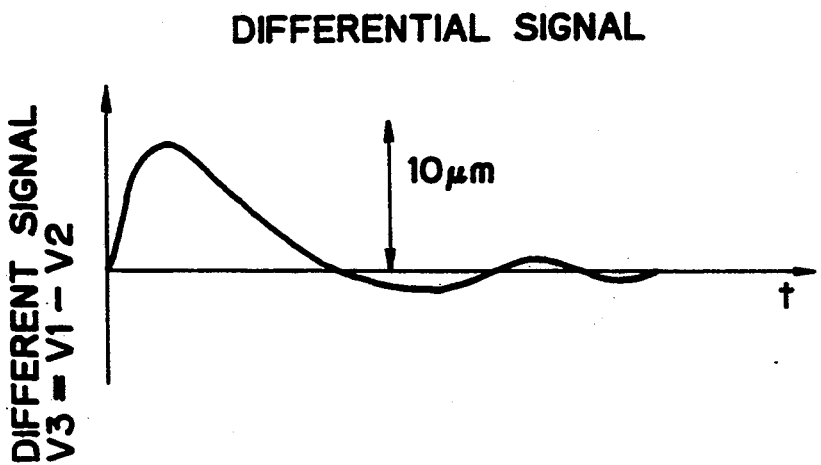

FIGS. 6(A) to 6(C) show signal waveforms obtained from the circuit of FIG. 1 with each exposure pattern being divided into subfields as shown in FIGS. 4(A) to 4(C) according to the present invention. When the beam 24 is deflected by the main deflector 7 from one subfield to the next one in the X-axis direction, new positional coordinates for the next subfield are set in the DAC 21, and a voltage V1 corresponding to the output of the DAC 21 rises as shown in FIG. 6(A). The rising output voltage V1 relates to the DAC 21 and amplifiers 23 and 29, which have a quick response speed less than about 1 $\mu$m for a positional movement of about 10 $\mu$m. Until the output voltage V1 of the DAC 21 settles, the positioning of the beam 24 is not reliable, so that there is no way to use this rise time.

FIG. 6(B) shows a terminal voltage V2 of the monitor resistor RM for monitoring the coils of the main deflector 7. Since the coils have inductance L, the voltage V2 rises slowly and takes about 100 $\mu$sec to settle.

FIG. 6(C) illustrates the waveform of a differential signal representing the difference between the two voltage signals V1 and V2 supplied to the differential amplifier 25.

Since the width of the subfield 33 in the X-axis direction is about 10 $\mu$m according to the present invention, the output V1 of the DAC 21 corresponds to a distance of 10 $\mu$m at the maximum. The monitor voltage V2 of the coil current rises slowly to take positive values. Accordingly, the differential voltage $V3 = V1 - V2$ rises in a positive direction at first and reaches a peak that is smaller than the value corresponding to the positional change of 10 $\mu$m. Thereafter, the differential signal V3 slowly decreases, slightly fluctuates, and settles. The typical time required for the differential signal V3 to settlement is about 100 $\mu$sec, which is the same as in the conventional technique. The absolute value of the differential signal V3, however, is always within the feedback correction possible area 35. Consequently, if the rise time of the DAC 21 is 0, the feedback correction will be carried out as soon as an instruction for deflecting a beam position is provided to the main deflector 7.

If exposure is completed before the settlement of a correction voltage based on the differential signal V3, and if the beam is deflected to the next subfield at once, the differential signal V3 may gradually increase to exceed the feedback correction possible area 35. To avoid this problem, a proper threshold value may be set. If the differential value V3 exceeds the threshold value, data for the next main deflector is not supplied to the DAC 21. Only after the differential value V3 drops below the threshold value is a deflection instruction provided.

Until the output voltage of the DAC 21 settles, signals to the differential amplifier 25 are not reliable, so that exposure of patterns must not be started before the DAC 21 settles. Since the DAC 21 (including the amplifiers 23 and 29) can settle within about 1 $\mu$sec, the wait time may be very short.

According to the embodiment of the invention mentioned above, the number of subfields in the X-axis direction is 10 times that of the prior art. For exposing an area of 10 mm square, the number of jumps of a beam by the main deflector 7 will be 100,000 according to the invention, so that a total wait time will be about 0.1 sec. This is about 1/10 the time that the prior art must wait until the current flowing through the coils of the main deflector 7 settles. Even when compared with our previous proposal explained with reference to FIGS. 1 and 2, the total wait time is reduced to $\frac{1}{4}$.

Since a jump distance by the main deflector is shortened, a change in magnetic flux is reduced to the chance of an eddy current occurring in the coils of the main deflector. When the width of the subfield in the X-axis direction is about 5 $\mu$m, a positional shift due to the eddy current will be about 0.002 $\mu$m, so that eddy current compensation may not always be needed. If the eddy current compensation mentioned before is carried out, an accuracy of 0.0005 $\mu$m will be realized.

When deflecting a beam from one band to the next, it is preferable to change the deflecting direction of the main deflector from one to another. For example, after the uppermost band of FIG. 4(A) is exposed from the left to the right, the beam is deflected downward and then deflected from the right to the left for the next band. Shuttling the beam to scan the bands in this way may reduce changes in the current flowing through the main deflector and shorten recovery time of the current.

In the above embodiment, stage 10 is continuously moved to expose the subfields. However, the invention is applicable to any exposure method which sequentially deflects a beam to subfields by a main deflector and scans each subfield by a subdeflector.

Two subdeflectors may be employed so that one of them carries out an original pattern scanning, and the other carries out corrections.

The present invention is not restricted by the embodiment explained above. For a person skilled in the art, it may be possible to make various modifications, improvements, combinations on the invention according to the embodiment.

According to the charged particle beam exposure method of the invention, the data processing unit 16 has, separately from the buffer 60 for temporarily latching a predetermined quantity of exposure pattern data from the memory 14, the subfield forming unit 70 for forming thin rectangular subfields such as those shown in FIG. 4(A) according to exposure pattern data for one main field stored in the buffer 60. Data for each subfield formed by the subfield forming unit 70 is supplied to the subdeflector controller 17.

Processes carried out in the subfield forming means 70 of the invention for dividing exposure pattern data into rectangular subfields shown in FIG. 4(A) will be explained.

Figure 7A:
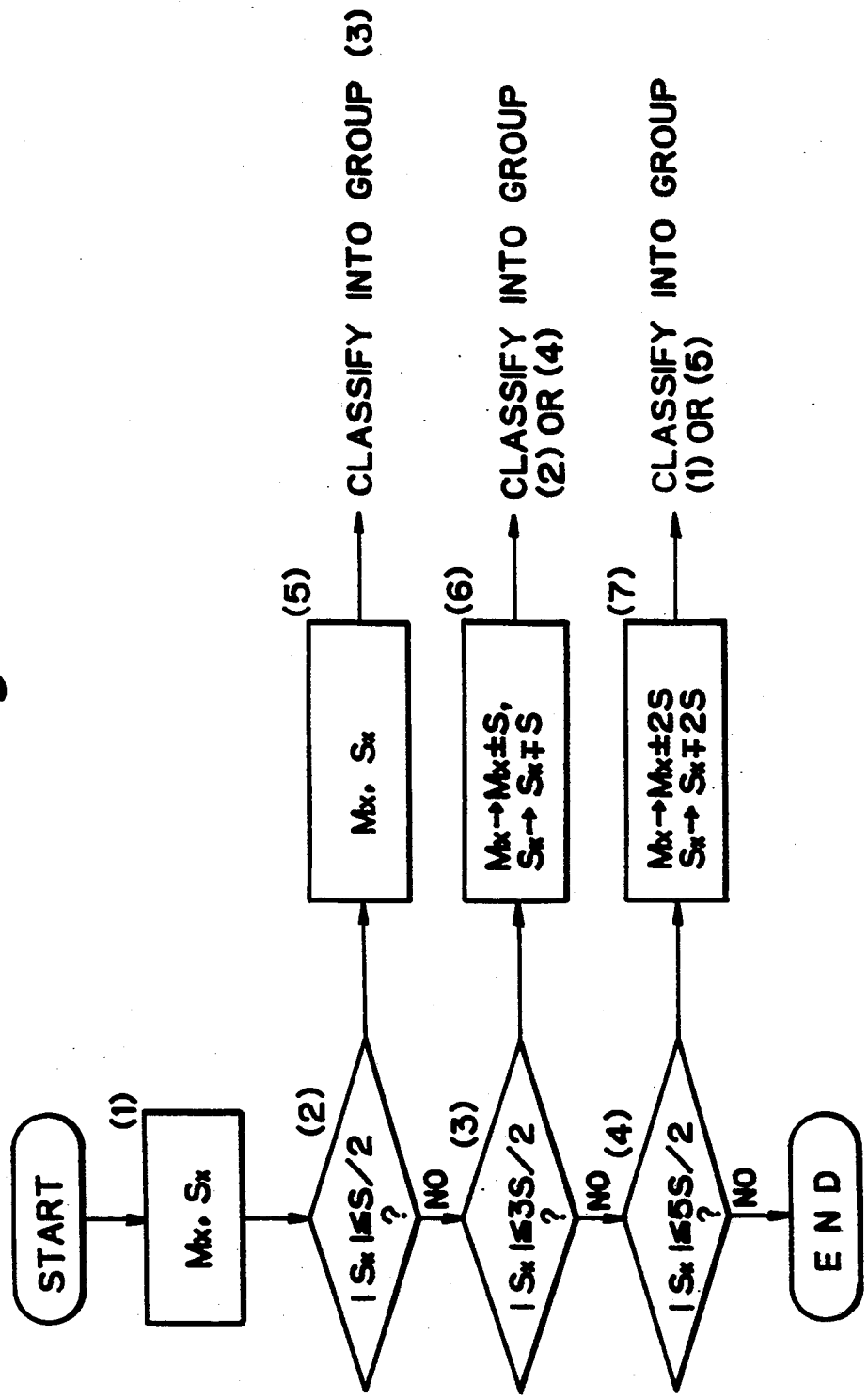
Figure 8A:
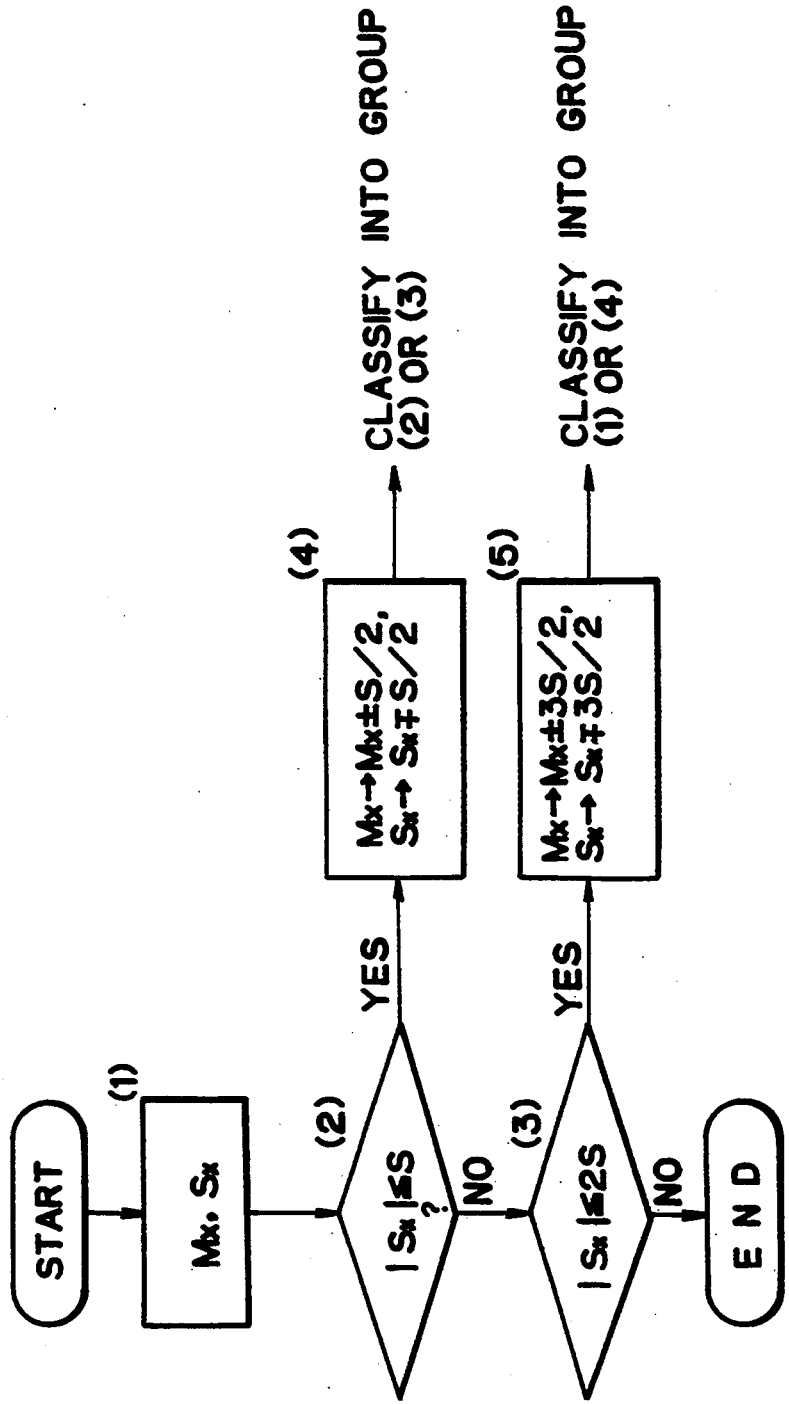

FIGS. 7(A) and 8(A) are flow charts explaining the processes carried out in the subfield forming unit 70, in which FIG. 7(A) divides each main field into an odd number of subfields each within a deflectable range of the subdeflector, and FIG. 8(A) divides the same into an even number of subfields.

As explained before, the prior art divides each main field into square subfields each having sides that are substantially equal to the maximum deflectable range of the subdeflector. According to the invention, opposing two sides of each subfield are shorter than the others. Namely, the invention divides exposure pattern data for one conventional subfield into a plurality of rectangular subfields whose short sides extend in the primary deflecting direction of the main deflector.

In FIG. 7(A), the primary deflecting direction of the main de:Elector is the direction of an axis X.

Exposure pattern data are stored as X-axis and Y-axis coordinates in the exposure pattern data memory 14. Each piece of the exposure pattern data comprises coordinate data (Mx, My) indicating a main field to which a given subfield belongs and coordinate data (Sx, Sy) indicating a given position in the subfield.

According to the embodiment, a shorter side of each subfield extends in the X-axis direction. Namely, the division is carried out in the X-axis direction, so that data related to the axis X are processed, and data related to the axis Y are not considered.

Referring to FIG. 7(A), Step (1) reads exposure pattern data (Mx, Sx) out of the buffer 60.

Figure 7B:
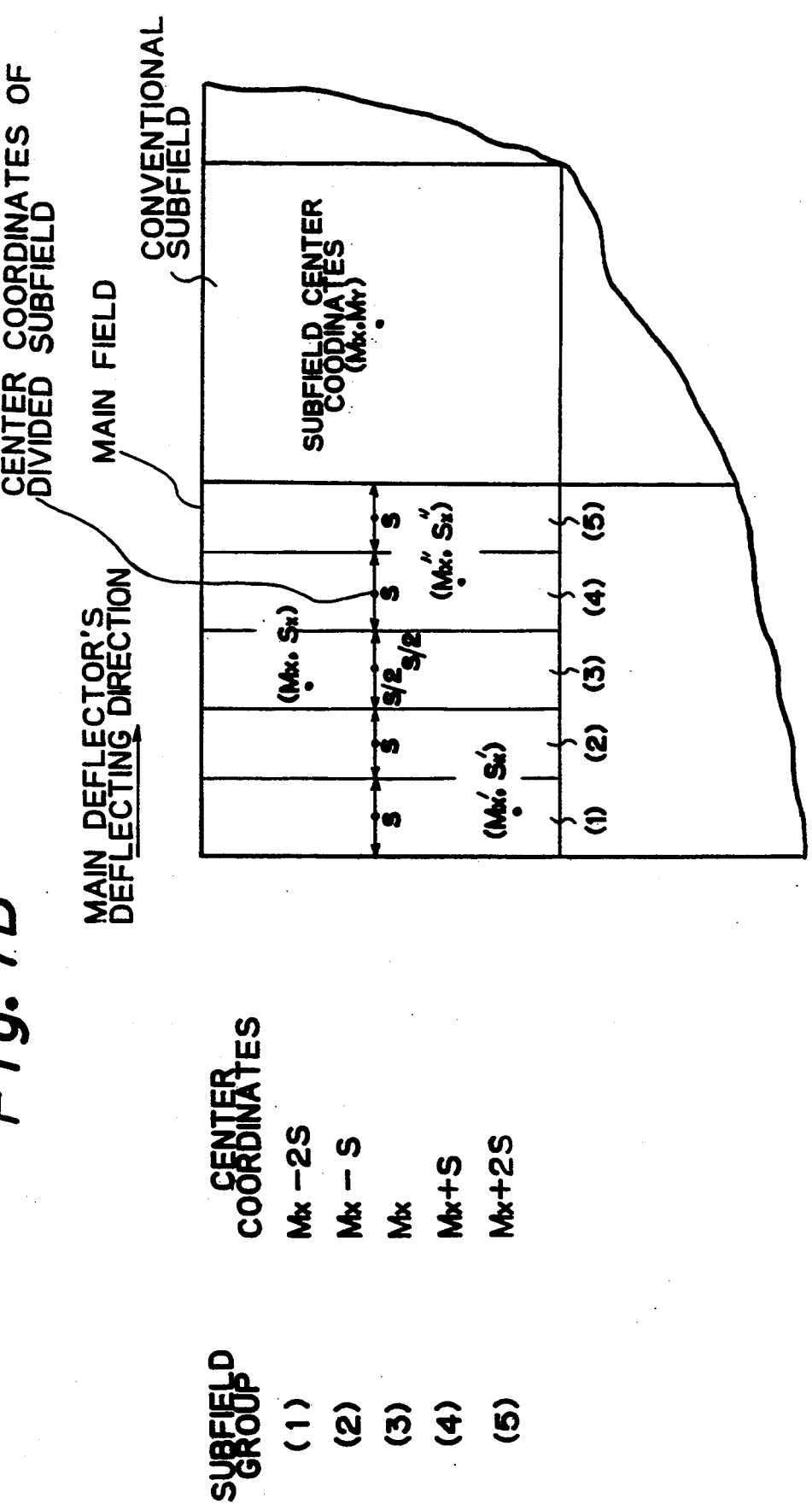

Step (2) determines if the absolute value of the X-axis coordinate Sx of a subfield in which the exposure pattern data is smaller than S/2. If the result is YES, Step (5) leaves the exposure pattern data (Mx, Sx) as they are and classifies the data as a thin subfield (3) whose center is identical to the center of a conventionally divided subfield, as shown in FIG. 7(B).

If in Step (2) the result is NO, Step (3) determines if the absolute value of the X-axis coordinate Sx is smaller than 3S/2. If the result is YES, Step (6) changes the exposure pattern data (Mx, Sx) into (Mx±S, Sx∓S), and classifies the data as one of subfields (2) and (4).

If in Step (3) the result is NO, Step (4) determines if the absolute value of the X-axis coordinate Sx is smaller than 5S/2. If the result is YES, Step (7) changes the exposure pattern data (Mx, Sx) into (Mx±2S, Sx∓2S), and classifies the data as one of subfields (1) and (5).

Similarly, in FIG. 8(A), Step (1) reads exposure pattern data (Mx, Sx) from the buffer 60.

Step (2) determines if the absolute value of the X-axis coordinate Sx of a subfield in the exposure pattern data is smaller than S. If the result is YES, Step (4) changes the exposure pattern data (Mx, Sx) into (Mx±S/2, Sx∓S/2), and classifies the data as one of thin subfields (2) and (3) formed on both sides of the center of a conventionally divided subfield.

If in Step (2) the result is NO, Step (3) determines if the absolute value of the X-axis coordinate Sx is below 2S. If the result is YES, Step (5) changes the exposure pattern data (Mx, Sx) into (Mx±3S/2, Sx∓3S/2), and classifies the data as one of subfields (1) and (4) as shown in FIG. 8(B).

The above processes are carried out for each of subfields contained in the exposure pattern data formed according to the prior art, thereby forming a plurality of rectangular subfields.

According to the invention, data related to the center of each subfield is supplied from the data processing means 16 to the main deflector control means 18, and exposure pattern data for the subfield is supplied from the data processing means 16 to the subdeflector control means 17 for carrying out an exposure process.

The exposure method according to the invention may employ the conventional feedback means for feeding a difference between a present beam position and an actual beam position for drawing patterns back to the subdeflector to correct a delay in the main deflector according to the difference.

Namely, the charged particle beam exposure method according to the invention may further comprise a step of detecting a present beam position deflected by the main deflector driving means; a step of detecting a difference between the detected beam position and a beam position specified by exposure data; a step of feeding the difference back to the subdeflector driving means; and a step of correcting the present beam position by deflecting the beam by the subdeflector according to the difference.

According to the charged particle beam exposure method of the invention, the length of a short side of each rectangular subfield is selected within a range in which a present beam position achieved by the main deflector is correctable by deflecting the beam by the subdeflector according to a correction voltage corresponding to a difference between the present beam position and a beam position specified by exposure data.

According to the charged particle beam exposure method of the invention, the stage for supporting an object to be exposed may be designed to stop while a beam is irradiating a given area of the object, or employ a step and repeat system in which the stage is continuously moved while the beam is irradiating a given area of the object.

As explained above, the invention shortens the wait of the main deflector, thereby shortening total exposure time. Accordingly, the invention improves the throughput of charged particle beam exposure.

We claim:

1. A charged particle beam exposure apparatus for exposing a main field on an object comprising:

a charged particle beam source for emitting a charged particle beam;

an electromagnetic main deflector for widely deflecting the beam;

an electrostatic subdeflector for speedily and precisely deflecting the beam;

first driving means for driving the main deflector;

second driving means for driving the subdeflector;

comparison means for comparing an output voltage of the first driving means with a voltage from the electromagnetic main deflector, said comparison means outputting a feedback signal corresponding to the difference between the output voltage and the voltage from the electromagnetic main deflector to the second driving means;

an exposure pattern data memory for storing all exposure pattern data to be drawn on the object by exposure;

data processing means for reading exposure pattern data for one main field of the object out of the exposure pattern data memory, controlling the first driving means according to the read data such that the beam is oriented toward the main field and successively deflected toward a plurality of subfields defined in the main field, and controlling the second driving means according to subfield data contained in the read data such that the beam is deflected toward predetermined regions in each of the subfields; and subfield forming means disposed in the data processing means, for dividing a main field into a plurality of subfields according to exposure pattern data for the main field read out of the exposure pattern data for the main field read out of the exposure pattern data memory, such that each of the subfields has a rectangular shape whose short sides extend in a primary deflecting direction of the main deflector, and wherein a value of said feedback signal generated when the main deflector moves from one subfield to the next subfield arranged adjacently thereto, is selectively set at a value which falls into a range which can be corrected for by said electrostatic subdeflector.

2. An apparatus according to claim 1, wherein the length of a short side of each rectangular subfield is ½ to 1/5 the length of a long side thereof.

3. An apparatus according to claim 2, wherein the length of a short side of each rectangular subfield is ⅓ to 1/5 the length of a long side thereof.

4. A charged particle beam exposure method applicable for a charged particle beam exposure apparatus having a charged particle beam source for emitting a charged particle beam; an electromagnetic main deflector for widely deflecting the beam; an electrostatic subdeflector for speedily and precisely deflecting the beam; a main deflector driving circuit for driving the main deflector; a subdeflector driving circuit for driving the subdeflector; an exposure pattern data memory for storing all exposure pattern data to be drawn on the object by exposure; the method comprising:

dividing a given main field into a plurality of subfields according to exposure pattern data for the main field read out of the exposure pattern data memory such that each of the subfields has a rectangular shape whose sides extend in a primary deflecting direction of the main deflector;

generating a feedback signal based on a difference in voltage between the output voltage of the main deflector driving circuit and a voltage at the electromagnetic main deflector;

setting the value of said feedback signal when the main deflector moves from one subfield to another subfield to a value which can be corrected by said electrostatic subdeflector;

successively selecting data for reference beam positions of subfields defined in the main field and supplying the selected data to the main deflector control driving circuit;

supplying data for scanning the selected subfield to the subdeflector driving circuit; and drawing predetermined exposure patterns in the subfield by deflecting the beam in the subfield by the subdeflector according to the exposure pattern data for the subfield, said electrostatic subdeflector deflecting said beam to a level corresponding to said feedback signal.

5. A method according to claim 4, wherein the length of a short side of each of the subfields is ½ to 1/5 the length of a long side thereof.

6. A method according to claim 4, wherein the length of a short side of each of the subfields is ⅓ to 1/5 the length of a long side thereof.

7. A method according to claim 4, wherein the deflecting direction of the beam by the main deflector in an X-axis direction is reversed whenever the beam is shifted in a Y-axis direction.

8. A method according to claim 4, wherein the feedback signal corresponds to a change in a current flowing through the main deflector and is formed according to a differential signal representing a difference between a voltage corresponding to an output of a digital-to-analog converter disposed for the main deflector and a voltage corresponding to the current flowing through the main deflector.

9. A method according to claim 8, wherein the deflection of the beam is carried out by adding the feedback signal to an analog pattern data signal to drive a single subdeflector.

10. A method according to claim 4, further comprising a step of setting the next main deflector data in a digital-to-analog converter disposed for the main deflector after the absolute value of a difference between a voltage corresponding to a current flowing through the main deflector and a voltage corresponding to the output of the digital-to-analog converter decreases below a predetermined value if the absolute value is greater than the predetermined value after the exposure of one subfield is completed.

11. A method according to claim 8, wherein the deflection of the beam by the subdeflector is carried out by driving a first subdeflector with the feedback signal and by driving a second subdeflector with the analog pattern data signal.

* * * * *

UNITED STATES PATENT AND TRADEMARK OFFICE
CERTIFICATE OF CORRECTION

PATENT NO. : 5,404,018
DATED : April 4, 1995
INVENTOR(S) : YASUDA et al.

It is certified that error appears in the above-identified patent and that said Letters Patent is hereby corrected as shown below:

Col. 3, line 34, change "l]deflects" to --8 deflects--.

Col. 11, line 48, change "de:Elector" to --deflector--.

Signed and Sealed this

Tenth Day of February, 1998

Attest:

BRUCE LEHMAN

Attesting Officer           Commissioner of Patents and Trademarks